(12) United States Patent
Rajendran et al.

(10) Patent No.: US 12,489,414 B2
(45) Date of Patent: Dec. 2, 2025

(54) POWER-COMBINER COMPRISING A PLURALITY OF PRIMARY COILS COUPLED TO A SECONDARY COIL, WHERE EACH OF THE PRIMARY AND SECONDARY COILS INCLUDES COUPLING PARTS AND NON-COUPLING PARTS

(71) Applicant: Steradian Semiconductors Private Limited, Bengaluru (IN)

(72) Inventors: Gireesh Rajendran, Bengaluru (IN); Alok Prakash Joshi, Bengaluru (IN)

(*) Notice: Subject to any disclaimer, the term of this patent is extended or adjusted under 35 U.S.C. 154(b) by 131 days.

(21) Appl. No.: 18/091,366

(22) Filed: Dec. 29, 2022

(65) Prior Publication Data
US 2024/0006736 A1  Jan. 4, 2024

(51) Int. Cl.
*H03H 7/48* (2006.01)
*H01P 5/16* (2006.01)

(52) U.S. Cl.
CPC .............. *H03H 7/482* (2013.01); *H01P 5/16* (2013.01)

(58) Field of Classification Search
CPC .................................. H03H 7/482; H01P 5/12
USPC .......................................................... 333/124
See application file for complete search history.

(56) References Cited

U.S. PATENT DOCUMENTS

| 10,601,390 | B2* | 3/2020 | Taniguchi | H03H 7/422 |
|---|---|---|---|---|
| 2013/0099864 | A1* | 4/2013 | Kawai et al. | H03F 3/245 |
| | | | | 330/276 |

* cited by examiner

*Primary Examiner* — Benny T Lee

(57) ABSTRACT

According to an aspect, method of combining a plurality of powers in an integrated circuit comprising receiving the plurality of powers on corresponding a plurality of primary coils, wherein each primary coil in the plurality of primary coils comprising a coupling part and a non-coupling part, coupling the plurality of powers to a secondary coil through only the coupling part, wherein the coupling part of every primary coil in the plurality of primary coils is inductively coupled to the secondary coil and nullifying power in the non-coupling part of a primary coils in the plurality of primary coil.

7 Claims, 3 Drawing Sheets

POWER-COMBINER COMPRISING A PLURALITY OF PRIMARY COILS COUPLED TO A SECONDARY COIL, WHERE EACH OF THE PRIMARY AND SECONDARY COILS INCLUDES COUPLING PARTS AND NON-COUPLING PARTS

BACKGROUND

Cross References to Related Application

This application claims priority from Indian Patent Application No. 202241037926 filed on Jul. 1, 2022 which is incorporated herein in its entirety by reference.

TECHNICAL FIELD

Embodiments of the present disclosure relate generally to Integrated circuits and more specifically to a low power integrated circuit with an efficient power combiner

RELATED ART

A low power integrated circuit is an integrated circuit (also referred to as chip) operative at low power and low operating voltages. As is well known in the art, when it is required to incorporate large number of devices (referred to as "very large scale integration"), to reduce size and/or to operate the integrated circuit at a very high frequency, the integrated circuits are built using nanometer technology (nano-technology) like 45 nm and 28 nm. In the low power integrated circuits, the devices like transistors, amplifiers etc., (In general, CMOS devices) are operative at low voltage levels to avoid voltage limited reliability failure.

In several applications such as Radar system, communication system etc., the low voltage integrated circuit may require to generate a high power signal. For example, when the low voltage integrated circuit incorporates/drives antennas for transmitting a signal, the highest possible output voltage may be required to be generated to meet the link budget (as is well known in the art of communication system) that in general corresponds to power gain or loss experienced by a signal between a transmitter and a receiver. In such situation, a numbers of low power amplifier outputs are combined to achieve the desired high power signal to feed the antennas. A power combiner combines the outputs of low power amplifiers to generate the high power signal. Several known techniques are adopted to combine the power and/or implement the power combiner.

In one conventional power combiner technique, the multiple power amplifiers are configured to drive a delay line, spaced at wavelength/2. The technique is more fully described in a book titled "RF Power Amplifiers for Wireless Communications" authored by Steve C. Cripps published with 978-1-59693-018-6. Such techniques suffer as the wavelength/2 routing requirements increases the area and routing loss on-chip.

Another conventional technique of power combiner is more fully described in U.S. Pat. No. 6,816,012 B2. In that, differential termination of opposite phase driven devices of adjacent amplification devices is a necessary condition for the combiner to work. This can be made true for either the input or the output but not for both as can be identified from the structure. This may increase signal loss in the presence of any output mismatch.

Another conventional technique is more fully described in the article titled "A 5.8 GHz 1 V Linear Power Amplifier Using a Novel On-Chip Transformer Power Combiner in Standard 90 nm CMOS" by Peter Haldi et, al, published in the year June 2008 by IEEE Journal of Solid-State Circuits 43(5):1054-1063. The literature is incorporate herein by reference. The limitations of such a technique is that, the loss from the secondary winding is doubled since its length is increased by a, factor of two compared to the primary to achieve the adjacent pair decoupling and impedance transformation.

Yet another conventional technique is more fully described in U.S. Pat. No. 6,816,012 B2. In that, the loss from the secondary return path is not eliminated. This adds additional loss without the benefit of a coupling in a favourable direction as in prior art discussed above.

Thus, an area efficient and low loss power combined power amplifier integrated circuit is required to deliver high output power at millimetre wave frequencies like 80 GHz while using lower nanometer CMOS technology nodes that at least overcome some of the disadvantages noted above in respect of the conventional techniques.

SUMMARY OF THE INVENTION

According to an aspect, method of combining a plurality of powers in an integrated circuit comprising receiving the plurality of powers on corresponding a plurality of primary coils, wherein each primary coil in the plurality of primary coils comprising a coupling part and a non-coupling part, coupling the plurality of powers to a secondary coil through only the coupling part, wherein the coupling part of every primary coil in the plurality of primary coils is inductively coupled to the secondary coil and nullifying power in the non-coupling part of a primary coils in the plurality of primary coil.

According to another aspect, the conductively overlapping the non-coupling part of a one primary coil in the plurality of primary coils with the non-coupling part of a other primary coil in the plurality of the primary coil such that current in the non-coupling part of one is opposite to current in the other. In that the plurality of coupling parts of the corresponding plurality of primary coils are coupled to a plurality parts of the secondary coil, the plurality parts of the secondary coil are non-overlapping. Also, the secondary coil may be fully coupled to one or more of the primary coils in the plurality of primary coils.

According to another aspect, a power combiner formed on an integrated circuit comprising, a secondary coil formed as a loop, the secondary coil having a first part and a second part, a first primary coil with a first coupling part and a first non-coupling part, first primary coil receiving a first signal power, the first coupling part is aligned with first primary part to inductively couple the first signal power to first primary part and a second primary coil with a second coupling part and a second non-coupling part, the second primary coil receiving the second signal power, the second coupling part is aligned with second primary part to inductively couple the second signal power to second primary part, wherein, the first non-coupling part and the second non-coupling parts are conductively overlapped such that the current through the overlapped first non-coupling part and the second non-coupling parts is zero.

According to another aspect, the loop is substantially a circular with first primary part and the second primary part being circumferences of two semi circles of the loop. In that, the first primary coil and second primary coil are conductor loops formed such that the first non-coupling part and the second non coupling part overlapping along a centerline dividing the loop in to two semicircles.

Several aspects are described below, with reference to diagrams. It should be understood that numerous specific details, relationships, and methods are set forth to provide a full understanding of the present disclosure. One who skilled in the relevant art, however, will readily recognize that the present disclosure may be practiced without one or more of the specific details, or with other methods, etc. In other instances, well-known structures or operations are not shown in detail to avoid obscuring the features of the present disclosure.

BRIEFS DESCRIPTION OF THE DRAWINGS

FIG. 11B illustrates the circuit depiction of inductive coupled combiner in an embodiment.

DETAILED DESCRIPTION OF THE PREFERRED EXAMPLES

Figure 1A:
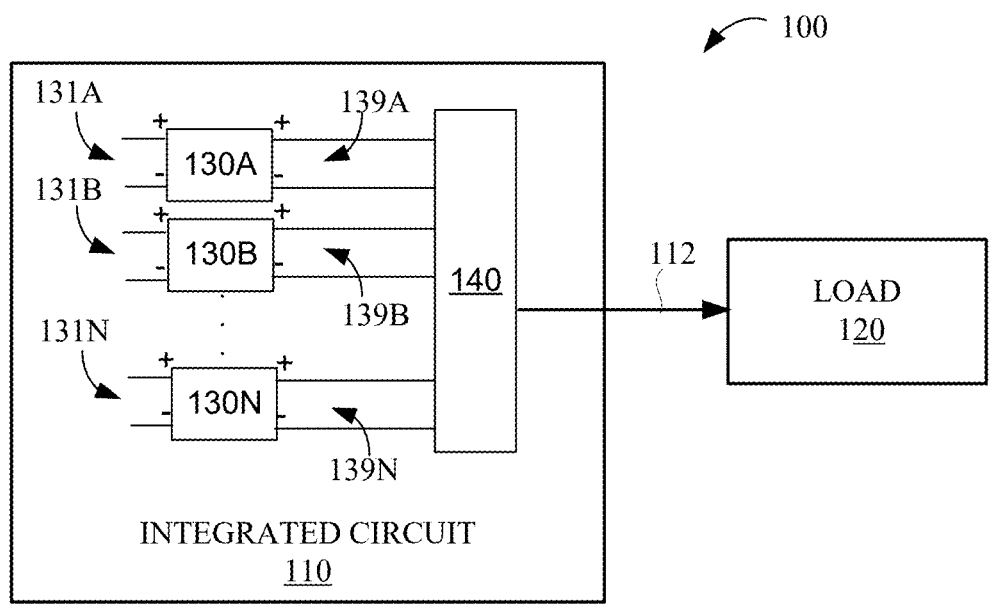
FIG. 1A is a block diagram of an example system (environment) in which various aspects of the present invention may be seen.

FIG. 1A is a block diagram of an example system 100 (environment) in which various aspects of the present invention may be seen. The environment is shown comprising Integrated Circuit (IC) 110 and load 120. IC 110 is shown driving the load 120. The load 120 comprises one or more of a transmit antenna, a RF transceiver etc. In one embodiment the load requires a certain power (voltage and/or current) to perform the desired operation. For example, when load 120 is an external antenna, the path 112 may require to carry a signal with the power matching/meeting the transmission power of the antenna/and or the link budget as is well known.

The integrated circuit 110 is implemented to operate at a low voltage and provide a high power signal on path 112. The path 112 may be a differential signal path for example. The integrated circuit 110 is shown driving the external load 120. In certain embodiment, the load 120 may be implemented within the integrated circuit 110. For example, the load 120 may be an on-chip antenna capable radiating the signal (transmitting) received on path 112.

The integrated circuit 110 is shown comprising power amplifiers 130A, 130B, . . . 130N and power combiner 140 as shown in FIG. 1A. In that, each power amplifier 130A, 130B, . . . 130N is shown with differential inputs 131A, 131B, . . . 131N marked as "+" and "-", may receive a signal for enhancing the power. The signal at the input of each power amplifier may be appropriately isolated using any known technique for power enhancement. The differential outputs 139A, 139B, . . . 139N of the power amplifiers is coupled to the power combiner 140.

The power combiner 140 combines the signal received on path 139A, 139B, . . . 139N to provide a high power signal on path 112. The power of the signal on path 112 is a combination of the power of the individual signal on paths 139A, 139B, . . . 139N. In one embodiment, the combiner 140 combines the power though inductive coupling (also referred to as "transformer coupling" or in general "coupling"). In that, a plurality of primary coils couple to a single secondary coil such that, individual power on the plurality of primary coils are inductively coupled to the secondary winding there by effectively enhancing the signal current/power in the secondary winding. Thus, though the devices in the integrated circuit are operative at low voltage, the secondary coil may be implemented to carry a higher current due to transformer coupling of plurality of primary coils.

Figure 1B:
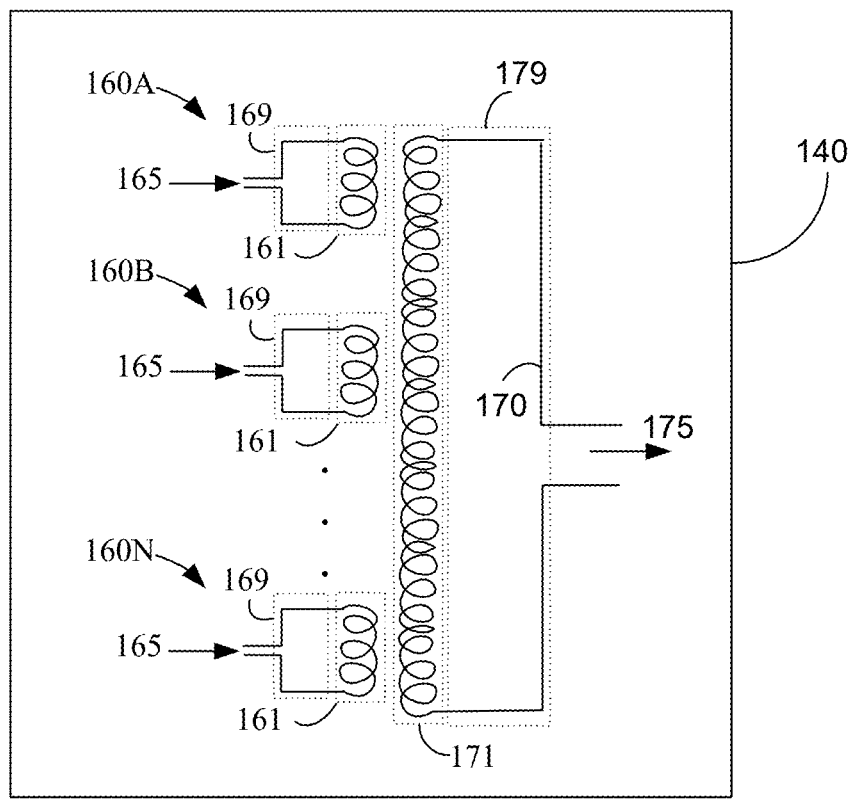

FIG. 1B illustrates the circuit depiction of inductive coupled combiner 140 in an embodiment. As shown there, the plurality of primary coils are depicted as inductors 160A, 160B, . . . 160N wherein each primary coil having a coupling part 161 and non-coupling part 169. The power/current from the corresponding power amplifier (not shown) is provided to the terminal 165. Similarly, the secondary coil 170 is shown with coupling part 171 and non-coupling part 179. The combined power output is provided on the terminal 175. In the primary coils, the coupling part 161 representing a part of the each coil 160A, 160B, . . . 160N that couples with the secondary coupling part 171. That means the current flowing in the part 161 causes the magnetic/inductive coupling with the secondary coupling part 171 thereby transferring energy/power to the secondary. While the current flowing in the non-coupling part 169 does not cause any magnetic coupling with the secondary coil 170. As against the conventional system, in a particular embodiment, the non-coupling part 161 does not cause loss of power in the combiner. Further, the non-coupling part 179 of the secondary coil 170 is minimised or substantially made null. That means, in a particular embodiment, the non-coupling part 179 is substantially made insignificant compared to the coupling part (for example say, the part 179 may form less than 1% of the coupling part 171). Thus, at least the power losses in the non-coupling part of one or both of primary and secondary coils are reduced. The manner in which the plurality of primary coils is efficiently coupled to the single secondary coils with reduced power loss and efficient use of the semiconductor space is further described below.

Figure 2:
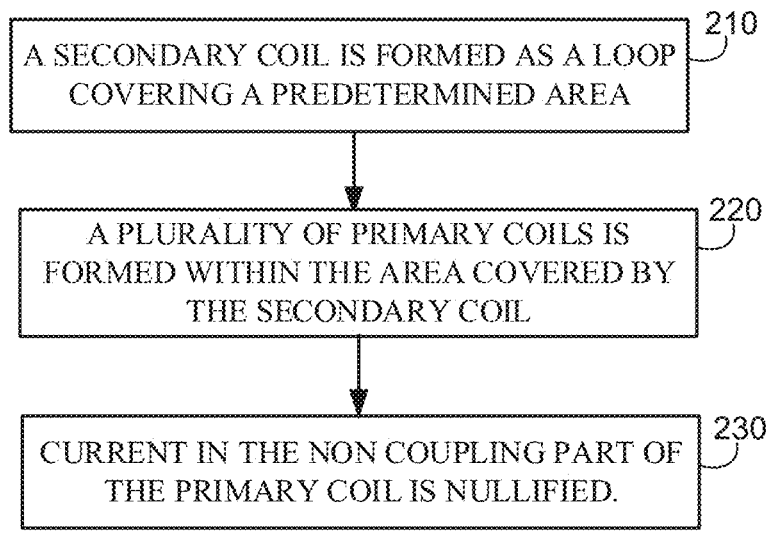
FIG. 2 is a block diagram illustrating the manner in which the power is combined by coupling the plurality of primary coils to a single secondary coil in one embodiment.

FIG. 2 is a block diagram illustrating the manner in which the power is combined by coupling the plurality of primary coils to a single secondary coil in one embodiment. In the block 210, a secondary coil is formed as a loop covering a predetermined area. For example, the conductive loop may be formed on a substrate of the integrated circuit. The thickness of the conductor forming the loop and the loop radius that determine the area covered by the loop may be suitably selected based on the expected maximum current and the desired inductance value of the coil. In the event of more than one loop is required to achieve the desired inductance value, the multiple loops may be formed with substantially same radius either slightly reduced or increased in radius on the same substrate or on a different layer in the integrated circuit.

In the block 220, a plurality of primary coils is formed within the area covered by the secondary coil. For example, the overall area covered by the secondary coil may be divided into two halves to form one primary coil within each half. As an example, two primary coils are formed on the same substrate along with the secondary coil. Any conductor overlapping may be avoided by using vias (as is well known in the art of IC fabrication).

In block 230, the current in the non-coupling part of the primary coil is nullified. For example, the current in the non-coupling part of the primary coil may be made zero by superimposing two current in the opposite direction. That is, for example, the non-coupling part of one primary coil and the non-coupling part of other primary coils are conductively merged such that the signal current through the merged non-coupling parts is zero at all the time. As a result, the combiner operates with the higher power coupling efficiency with reduced power loss.

Figure 3:
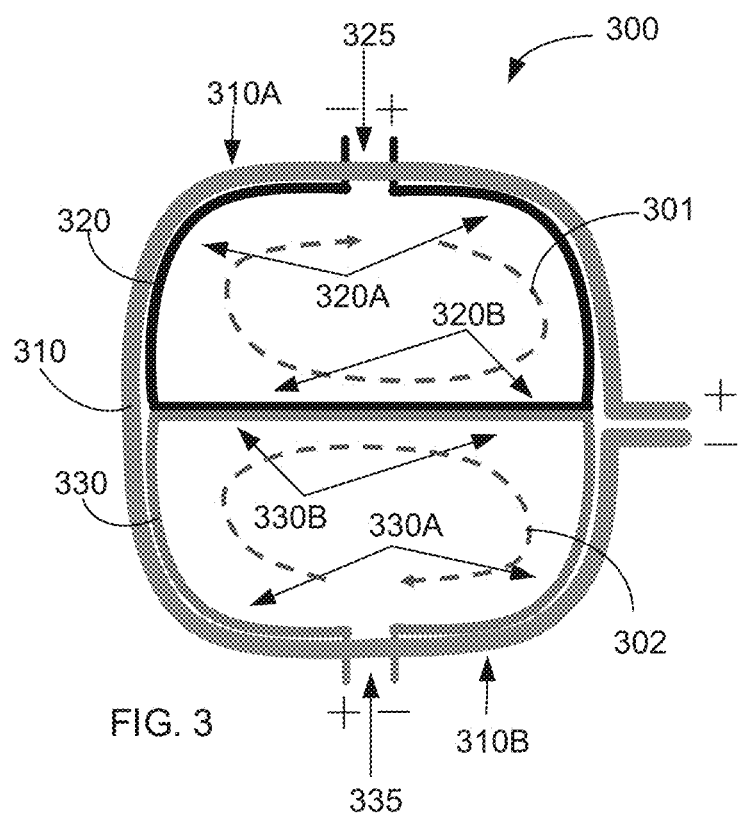
FIG. 3 illustrates the manner in which the primary and secondary coil may be implemented in an embodiment.

FIG. 3 illustrates the manner in which the primary and secondary coil may be implemented in an embodiment. The combiner 300 is shown comprising a secondary coil 310 and two primary coils 320 and 330. As shown there, the two primary coils 320 and 330 comprise coupling part 320A and 330A respectively. The non-coupling parts 320B and 330B of the primary coils 320 and 330 are shown conductively overlapping. The primary coils 320 and 330 are shown receiving differential input 325 and 335 such that, the polarity i.e. +,- of connections (input signal) at 325 and 335 result in a current (301 and 302) that is opposite in direction at the non-coupling parts 320B and 330B. In other words, the direction of signal current in 320B is opposite to the current 330B, thus cancelling each other to a net current of zero in the merged/overlapped part of 320B and 330B. Further, the coupling parts 320A and 330A carry a differential current proportional to the signal received at 325 and 335. The 320A and 330A couples the power/energy to the secondary coil 310. In that, the secondary coil is shown with two parts 310A and 310B, wherein the part 310A couples with primary coil 320 through coupling part 320A. Similarly, part 310B couples with primary 330 through coupling part 330A. As may be appreciated, no part of the secondary 310 is uncoupled with primary. As a result, the secondary coupling efficiency is enhanced and the power loss in the secondary is reduced.

As may be appreciated, no part of the secondary coil 310 is uncoupled with primary. As a result, the secondary coupling efficiency is enhanced and the power loss in the secondary is reduced. The word "within" in the context of the secondary is not limiting only to the formation of primary coil on the inner periphery of the secondary coil but includes and covers the possible implementation of primary coils on the outer periphery of the secondary coil as well.

Figure 4:
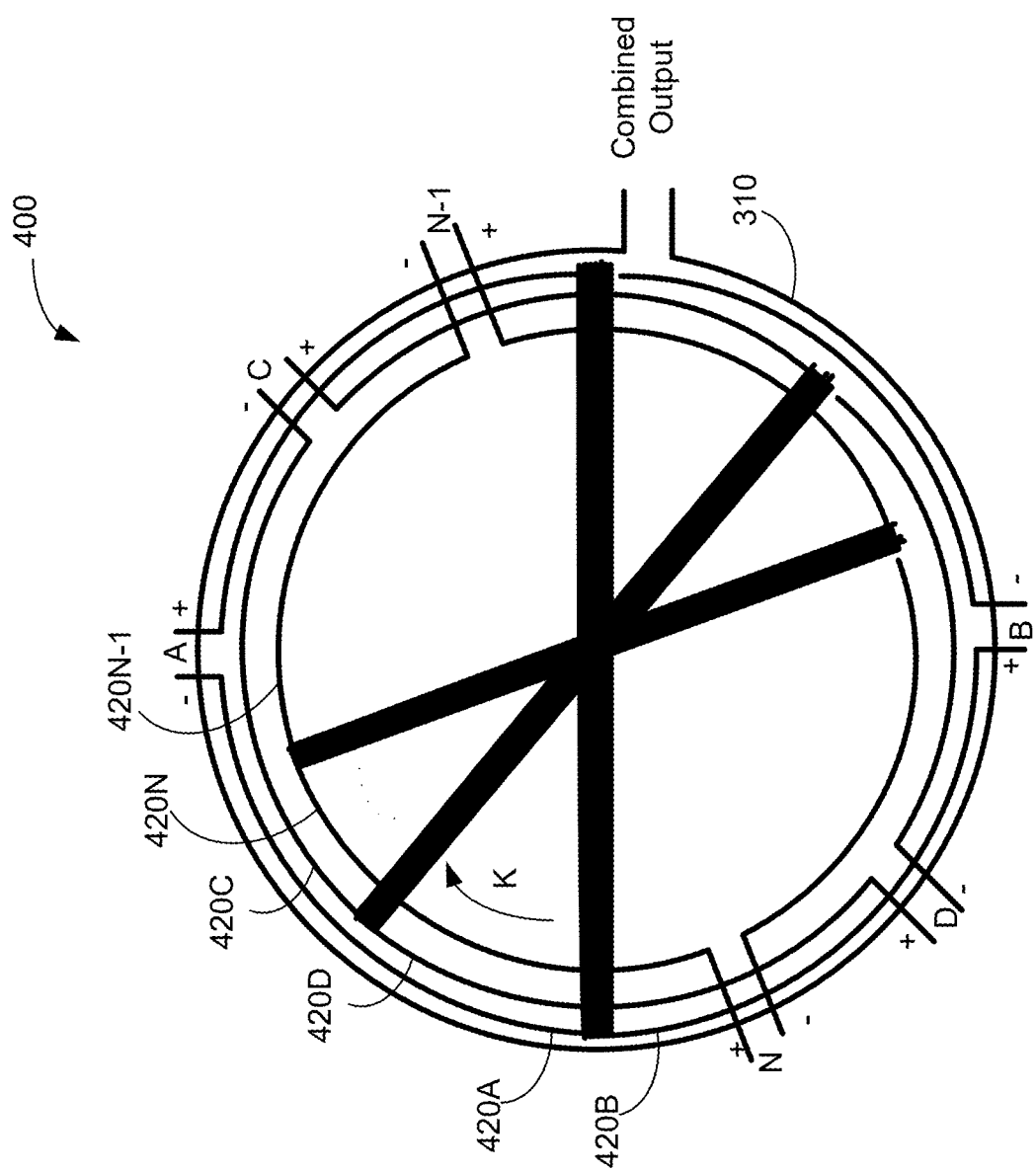
FIG. 4 illustrates the manner in which more than two primary coils may be coupled to a single secondary coil within the area covered by the secondary coil.

FIG. 4 illustrates the manner in which more than two primary coils may be coupled to a single secondary coil providing combined output within the area covered by the secondary coil. The combiner 400 is shown comprising the secondary coil 310 and plurality of primary coils 420A, 420B, 420C, 420D, 420N-1, 420N (also recognisable by "A", "B". "C", "D" through "N-1" and "N" marked at the respective differential input terminals marked as + and -). As shown there, a pair of primary coils 420A and 420B is formed similar to coils 320 and 330 as described above in FIG. 3. The second pair 420C and 420D are formed on another layer of the integrated circuit geometrically following the contour of the secondary coil 310 with overlapping non-coupling part formed at an angle K from the overlapping part (like 320B and 330B in FIG. 3). Thus, even numbered primary coils (in multiple of twos) may be arranged in pairs to cancel the current in the non-coupling part.

While various examples of the present disclosure have been described above, it should be understood that they have been presented by way of example, and not limitation. Thus, the breadth and scope of the present disclosure should not be limited by any of the above described examples, but should be defined in accordance with the following claims and their equivalents.

What is claimed is:

1. A method of combining a plurality of powers in an integrated circuit comprising:
   receiving the plurality of powers on a corresponding a plurality of primary coils, wherein each primary coil in the plurality of primary coils comprising a respective coupling part and a respective non-coupling part;
   coupling the plurality of powers from the corresponding plurality of primary coils to a secondary coil through only the coupling parts of the respective plurality of primary coils, wherein only the coupling part of every primary coil in the plurality of primary coils is inductively coupled to the secondary coil; and
   nullifying power in the respective non-coupling part of each primary coils in the plurality of primary coils.

2. The method of claim 1, further comprising conductively over lapping the respective non-coupling part of one primary coil in the plurality of primary coils with the respective non-coupling part of another primary coil in the plurality of the primary coils such that current in the respective non-coupling part of the corresponding one primary coil is opposite to current in the respective non-coupling part of the another primary coil.

3. The method of claim 2, wherein the plurality of coupling parts of the corresponding plurality of primary coils are coupled to a plurality of parts of the secondary coil, the plurality of parts of the secondary coil are non overlapping.

4. The method of claim 3, wherein the secondary coil is fully coupled to one or more of the primary coils in the plurality of primary coils.

5. A power combiner formed on an integrated circuit comprising:
   a secondary coil formed as a loop, the secondary coil having a first part and a second part;
   a first primary coil with a first coupling part and a first non-coupling part, the first primary coil receiving a first signal power, the first coupling part is aligned with the first part of the secondary coil to inductively couple the first signal power to the first part; and
   a second primary coil with a second coupling part and a second non-coupling part, the second primary coil receiving a second signal power, the second coupling part is aligned with the second part of the secondary coil to inductively couple the second signal power to the second part,
   wherein, the first non-coupling parts and the second non-coupling parts are conductively overlapped such that the current through the overlapped first non-coupling part and the second non-coupling parts is zero.

6. The power combiner of claim 5, wherein the loop is substantially circular in shape with the first part and the second part being non overlapping circumferences of two semi circles of the loop.

7. The power combiner of claim 6, wherein the first primary coil and the second primary coil are respective conductor loops formed such that the first non-coupling part and the second non coupling part are overlapping along a centerline dividing the respective loop into two semi circles.

* * * * *